US012567450B2

(12) United States Patent
Chang et al.

(10) Patent No.: US 12,567,450 B2
(45) Date of Patent: *Mar. 3, 2026

(54) MRAM CIRCUIT AND LAYOUT

(71) Applicant: UNITED MICROELECTRONICS CORP., Hsin-Chu City (TW)

(72) Inventors: Ting-Hao Chang, Kaohsiung City (TW); Chien-Yu Ko, Tainan City (TW); Cheng-Tung Huang, Kaohsiung City (TW); Wen-Liang Huang, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 119 days.

This patent is subject to a terminal disclaimer.

(21) Appl. No.: 18/752,801

(22) Filed: Jun. 25, 2024

(65) Prior Publication Data

US 2025/0356895 A1     Nov. 20, 2025

(30) Foreign Application Priority Data

May 15, 2024    (TW) ................................. 113117922

(51) Int. Cl.
*G11C 11/16* (2006.01)
*G11C 11/15* (2006.01)
*H10B 61/00* (2023.01)

(52) U.S. Cl.
CPC ............ *G11C 11/161* (2013.01); *G11C 11/15* (2013.01); *G11C 11/1673* (2013.01); *G11C 11/1675* (2013.01); *H10B 61/22* (2023.02)

(58) Field of Classification Search
CPC ... G11C 11/161; G11C 11/15; G11C 11/1673; G11C 11/1675; H10B 61/22
See application file for complete search history.

(56) References Cited

U.S. PATENT DOCUMENTS

| | | | | |
|---|---|---|---|---|
| 9,659,623 | B1 * | 5/2017 | Sadd ................... | G11C 11/1657 |
| 10,593,396 | B2 * | 3/2020 | Tzoufras ............. | G11C 11/1675 |
| 10,600,478 | B2 * | 3/2020 | Tzoufras ............... | G11C 11/161 |
| 10,651,235 | B1 * | 5/2020 | Wu ........................ | H10B 61/22 |
| 11,514,963 | B2 * | 11/2022 | Drouard ................. | H10N 50/10 |
| 12,178,052 | B2 * | 12/2024 | Wu ........................ | H10B 61/22 |
| 2009/0161413 | A1 * | 6/2009 | Yoon ................... | G11C 11/1675 365/158 |
| 2009/0323397 | A1 * | 12/2009 | Kinoshita ............ | G11C 13/003 365/189.15 |
| 2010/0265749 | A1 * | 10/2010 | Wang ................. | H10N 70/8836 257/421 |

(Continued)

*Primary Examiner* — Jay W. Radke
(74) *Attorney, Agent, or Firm* — Winston Hsu

(57) ABSTRACT

A MRAM circuit is provided in the present invention, wherein each memory cell has three transistors, including a first transistor, a third transistor and a second transistor connected in order and series connection, a first node is connected between the first transistor and the third transistor, a second node is connected between the second transistor and the third transistor, and a common source line is connected with one terminal of the first transistor and the second transistor. A first MTJ set includes at least two MTJs in series connection and with one terminal connected to the first node, and a second MTJ set includes at least two MTJs in series connection and with one terminal connected to the second node.

17 Claims, 5 Drawing Sheets

(56) References Cited

U.S. PATENT DOCUMENTS

| | | | | |
|---|---|---|---|---|
| 2011/0069534 | A1* | 3/2011 | Inaba | G11C 11/16 |
| | | | | 365/158 |
| 2013/0258750 | A1* | 10/2013 | Kim | G11C 13/003 |
| | | | | 365/158 |
| 2015/0179924 | A1* | 6/2015 | Romanovskyy | G11C 11/161 |
| | | | | 365/158 |
| 2017/0169873 | A1* | 6/2017 | Appeltans | G11C 11/1657 |
| 2020/0013455 | A1* | 1/2020 | Tzoufras | G11C 11/5607 |
| 2020/0013456 | A1* | 1/2020 | Tzoufras | H10N 50/80 |
| 2021/0210127 | A1* | 7/2021 | Drouard | G11C 11/1675 |
| 2021/0376226 | A1* | 12/2021 | Yuh | G11C 11/161 |
| 2022/0148635 | A1* | 5/2022 | Yogendra | G11C 11/1675 |
| 2022/0208244 | A1* | 6/2022 | Song | H10N 50/10 |
| 2022/0384523 | A1 | 12/2022 | Wu | |
| 2023/0133622 | A1* | 5/2023 | Song | G11C 13/003 |
| | | | | 365/148 |
| 2024/0005974 | A1* | 1/2024 | Xing | G11C 11/1693 |
| 2025/0072007 | A1* | 2/2025 | Wu | G11C 11/1675 |

* cited by examiner

MRAM CIRCUIT AND LAYOUT

BACKGROUND OF THE INVENTION

1. Field of the Invention

The present invention relates generally to a magnetoresistive random access memory (MRAM) circuit and layout, and more specifically, to a MRAM circuit with vertically stacked magnetic tunnel junctions (MTJs) and layout thereof.

2. Description of the Prior Art

Magnetoresistive random access memory (MRAM) is a kind of emerging memory highly-anticipated in recent years, with advantages comparable to all kinds of existing memory. For example, MRAM has an access speed comparable to SRAM, with non-volatility and low power consumption like Flash, and with high integrity and durability like DRAM. More important, the process of forming MRAM devices may be integrated in available semiconductor BEOL (back-end-of-line) processes. Thus, it has a potential to become primary memory used in semiconductor chips. The storage device of MRAM is usually disposed in a level between a lower interconnect and an upper interconnect, including magnetic tunnel junctions (MTJs) cooperating with one or more transistors to control circuit switch during read/write operation. Unlike conventional memory using electric charge to store data, an external magnetic field is applied in the write operation of MRAM to control the polarization direction of MTJs and obtain different tunnel magnetoresistances (TMR), so that corresponding storage states may be defined to store digital data.

In response to the miniaturization demand of various electronic produces nowadays, how to accommodate more memory cells in a limited layout area and scale the memory cells for improving layout utilization has become an essential topic for those of skilled in the art to develop and research, in hope of applying MRAM more widely and maturely in memory field.

SUMMARY OF THE INVENTION

In the light of the aforementioned demands of miniaturizing memory cells and increasing memory capacity in unit layout area, the present invention hereby provides a novel MRAM circuit and relevant layout structure, with features of a plurality of stacked magnetic tunnel junctions (MTJs) in series connection on each storage node to implement multistate write and read operation, improving memory capacitor in unit layout area.

One aspect of the present invention is to provide a MRAM circuit with multiple memory cells, wherein each of the memory cells includes: three transistors, including a first transistor, a third transistor and a second transistor in order and series connection, wherein a junction of the first transistor and third transistor is first node, a junction of the second transistor and third transistor is second node, the other terminals of the first transistor and third transistor are connected to a common source line; a first MTJ set, including at least two MTJs in series connection and with one terminal connecting to the first node; and a second MTJ set, including at least two MTJs in series connection and with one terminal connecting to the second node.

Another aspect of the present invention is to provide a MRAM layout with multiple memory cells set up on a substrate, and the substrate is provided with multiple active areas extending in a first direction, wherein each of the memory cells includes: a first word line, a third word line and a second word line arranged sequentially and spaced-apart on the substrate and extending in a second direction over the active areas, wherein the active area at outer side of the first word line is first active area, the active area between the first word line and the third word line is second active area, the active area between the second word line and the third word line is third active area, and the active area at outer side of the second word line is fourth active area; a first MTJ set, including at least two MTJs in series connection in different levels of semiconductor BEOL metal layers and with one terminal connected to the second active area; a second MTJ set, including at least two MTJs in series connection in different levels of the semiconductor BEOL metal layers and with one terminal connected to the third active area; a first bit line, connected to another terminal of the first MTJ set; and a second bit line, connected to another terminal of the second MTJ set.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
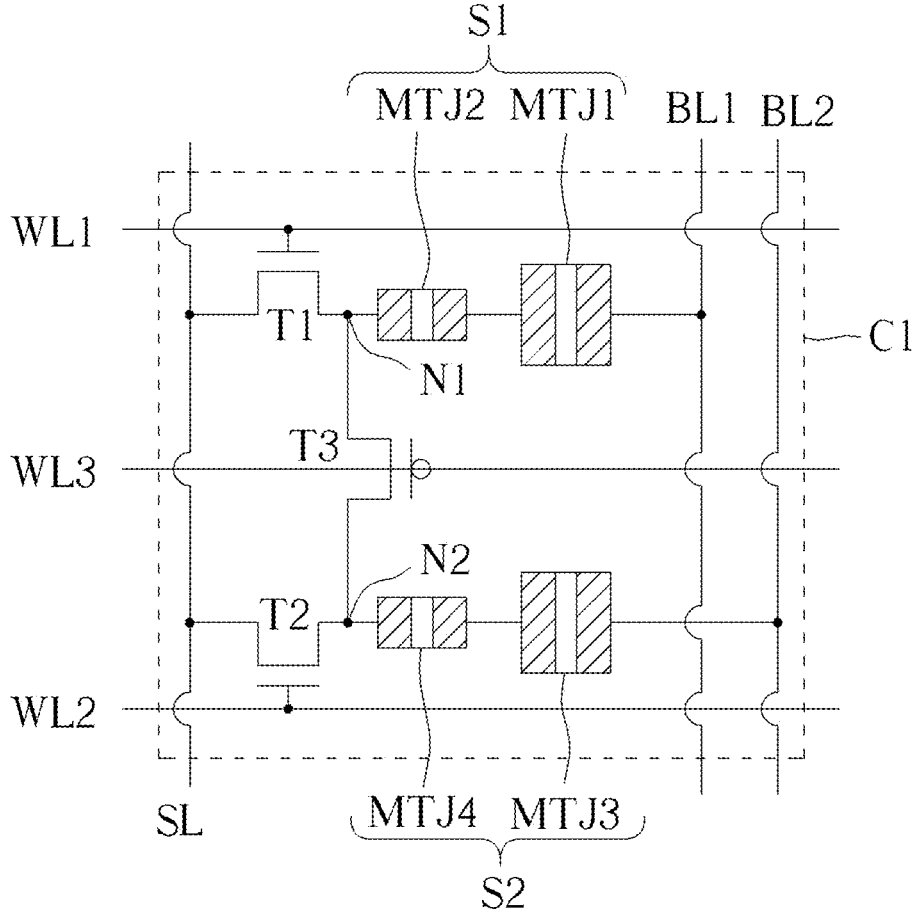
FIG. 1 is a circuit diagram of a MRAM in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms (e.g., "beneath," "below," "lower," "above," "upper" and the like) may be used herein for ease of description to describe one element or a relationship between a feature and another element or feature as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Firstly, please refer to FIG. 1, which is a circuit diagram of a MRAM in accordance with the preferred embodiment of present invention. This embodiment takes 3T4M (three transistor and fourth storage devices) MRAM architecture to describe components and interconnection therebetween in the MRAM circuit of present invention. Although the memory cell shown in the embodiment includes four storage devices, please note that there might be more storage cells included in a cell in actual implementation. The scope of present invention is not limited thereto and should be defined by accompanying claims.

The MRAM circuit of present invention includes multiple memory cells, which may be arranged regularly on a layout plane in a cell array or block, and might share a number of word lines and bit lines. For the conciseness of specification, only one memory cell C1 is shown in the circuit of FIG. 1 as an example, and other memory cells in MRAM are considered as having identical or similar structure. As shown in FIG. 1, each memory cell C1 includes three transistors T1, T2, T3 and fourth storage devices MTJ1-MTJ4 (ex. magnetic tunnel junction, MTJ). In addition, each memory cell C1 is provided with two bit lines BL1, BL2 and three word lines WL1-WL3. In the embodiment, the first transistor T1, third transistor T3 and second transistor T2 are connected in order and series connection, i.e. their source/drain are connected one by one with each other. In the aspect of circuit, the gates of first transistor T1, second transistor T2 and third transistor T3 are connected respectively to the first word line WL1, the second word line WL2 and the third word line WL3. Theses word lines are gates of corresponding transistors in actual structure.

Refer still to FIG. 1. In the embodiment, a junction of the first transistor T1 and third transistor T3 is first node N1 (or referred as storage node), while a junction of the second transistor T2 and third transistor T3 is second node N2, and the other terminals of the first transistor T1 and third transistor T3 are connected to a common source line SL. A first MTJ set S1 and a second MTJ set S2 are connected respectively on the first node N1 and the second node N2. The two MTJs are components responsible for storing data in the MRAM of present invention. More specifically, in the embodiment of present invention, each MTJ set S1, S2 is provided with at least two MTJs in series connection. The first MTJ set S1 includes a first MTJ1 and a second MTJ2 in series connection, wherein one terminal of the second MTJ2 is coupled to the first node N1 and one terminal of the first MTJ1 is coupled to the first bit line BL1. The second MTJ set S2 includes a third MTJ3 and a fourth MTJ4 in series connection, wherein one terminal of the fourth MTJ4 is coupled to the second node N2 and one terminal of the third MTJ3 is coupled to the second bit line BL2. Please note that the MTJ sets S1, S2 with two MTJs respectively in the figure is only an example. In other embodiment, each MTJ set S1, S2 may be provided with more than two MTJ devices in series connection, in order to fulfill more storage states and achieving more memory capacity in unit layout area.

Figure 2:
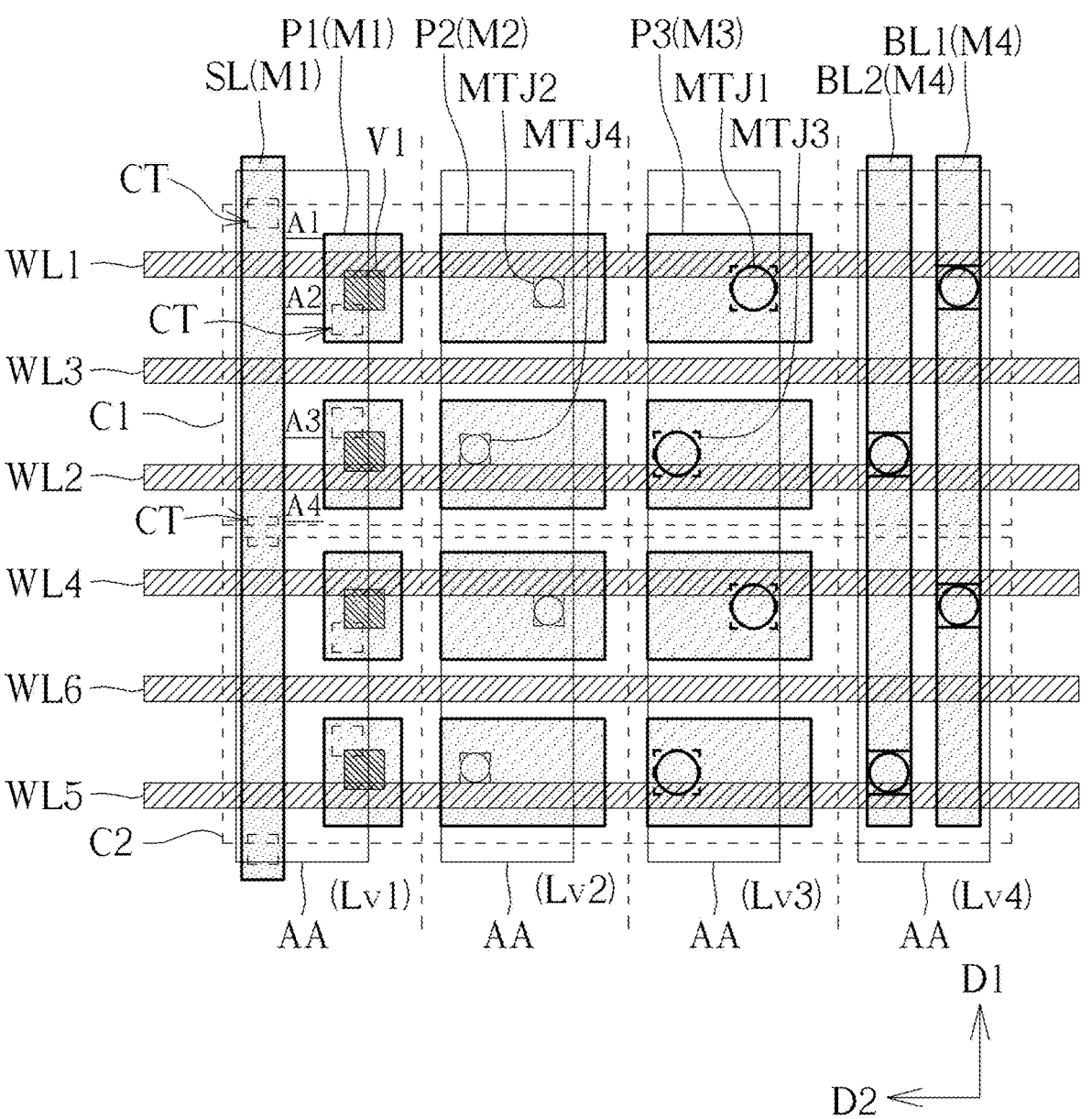
FIG. 2 is a layout of the MRAM in accordance with the preferred embodiment of present invention.
Figure 3:
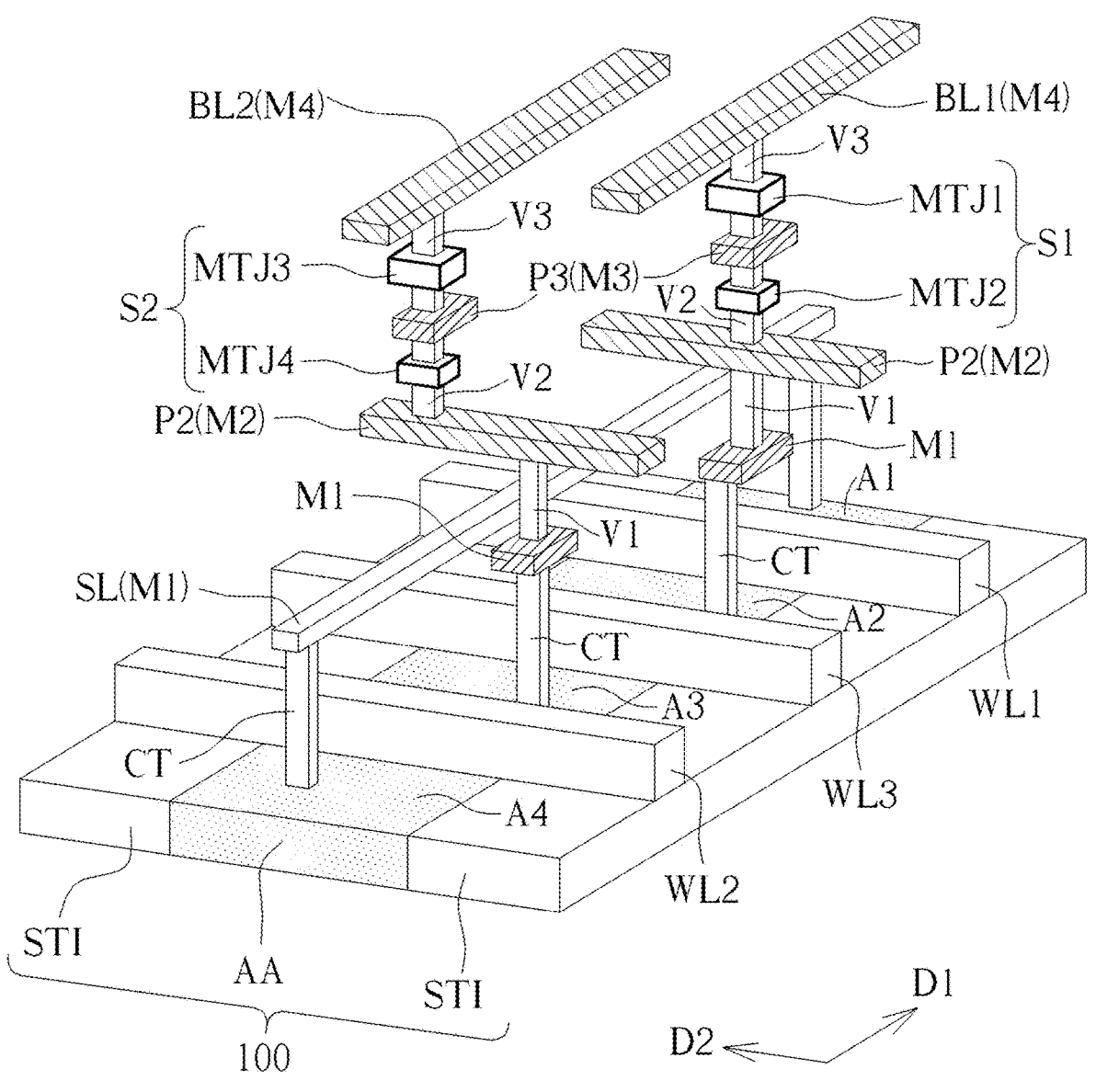
FIG. 3 is an isometric view of the MRAM in accordance with the preferred embodiment of present invention.

After describing the architecture of MRAM circuit of the present invention, please refer to FIG. 2 and FIG. 3 at the same time, which are a layout plane and an isometric view of the MRAM respectively in accordance with the preferred embodiment of present invention, for describing the overlapping patterns and interconnection of the components of MRAM in vertical direction in actual layout plane of the present invention, in order to provide a better understanding of explicit structure of the MRAM of present invention for readers. Please note that the layout of FIG. 2 is presented in a way displaying multiple layers in single figure simultaneously, wherein the layout is divided into four sections, including levels Lv1-Lv4. These four sections are completely overlapped in a direction vertical to the substrate, and the active areas AA therein are the same active area. This presentation format may provide a clear understanding for reader about the overlap relationship between component patterns of the MRAM of present invention, and the isometric view of FIG. 3 further illustrates a 3D structure of one memory cell, which is stated herein in advance.

As shown in FIG. 2 and FIG. 3, the MRAM of present invention is set up on a semiconductor device 100. The substrate 100 may be a silicon substrate, multiple active areas AA with different conductivity may be formed therein beforehand through ion implantation process, and silicon oxide based shallow trench isolations (STIs) may be formed to isolate the active areas AA (only one active area shown in the figure). The active area AA extends in a horizontal first direction D1, with multiple word lines WL1-WL6 arranged and spaced-apart thereon and extending in a horizontal second direction D2 over the active area AA. The second direction D2 is preferably perpendicular to the first direction D1. In the embodiment of present invention, every three word lines is considered as a group to control the switch of transistors in every memory cell in corresponding memory row. For example, the word lines WL1-WL3 are considered as a group to control the switch of transistors in memory cell C1, while the word lines WL4-WL6 are considered as a group to control the switch of transistors in memory cell C2.

Refer still to FIG. 2 and FIG. 3. The word lines WL1-WL6 divide the active area AA into multiple active subareas. As shown in the figure, the active area at outer side of the first word line WL1 is first active area A1, the active area between the first word line WL1 and the third word line WL3 is second active area A2, the active area between the second word line WL2 and the third word line WL3 is third active area A3, and the active area at outer side of the second word line WL2 is fourth active area A4. In the embodiment of present invention, these active areas A1-A4 functions as sources/drains of the transistors. Specifically, the first word line WL1 functions as a gate for the first transistor T1 (FIG. 1), with active areas A1, A2 at two sides functions respectively as source and drain of the first transistor T1. The second word line WL2 functions as a gate for the second transistor T2, with active areas A3, A4 at two sides functions respectively as source and drain of the second transistor T2. With respect to the third word line WL3, the active areas A2, A3 at two sides of the word line function as source and drain of the third transistor T3. With this design, the first transistor T1 and third transistor T3 (FIG. 1) share the same active area A2, meaning they are in series connection, while the second transistor T2 and the third transistor T3 (FIG. 1) share the same active area A3, meaning they are in series connection.

Refer still to FIG. 2 and FIG. 3. In addition to the active area AA, component patterns in a first metal layer M1 above the active area AA is illustrated in the level Lv1. In the embodiment of present invention, the patterns of first metal layer (M1) include a source line SL and several patterns P1. Among them, the source line SL extends in a first direction D1 over multiple word lines WL1-WL6 and overlapping the active area AA, and the active areas A1, A4 at outer sides of the memory cell C1 are connected respectively to the source line SL through contacts CT. With this architecture, the source line SL in the embodiment of present invention will be shared by every memory cell (ex. C1, C2) in corresponding memory column. For example, the active area A4 shared by the memory cell C1 and memory cell C2 is connected to the source line SL through a common contact CT. In another aspect, the active areas A2, A3 inner the memory cell C1 are connected respectively to corresponding patterns P1 of the first metal layer M1 above through contacts CT, which exactly the positions of first node N1 and the second node N2 in the circuit of FIG. 1, and each pattern P1 is further connected to a pattern P2 of a second metal layer M2 and a storage device further above through via V1.

Refer still to FIG. 2 and FIG. 3. Component patterns P2 in the second metal layer M2 above the first metal layer M1 and parts of the MTJs (MTJ2, MTJ4) in the MRAM structure are illustrated in level Lv2. In the level Lv2, each pattern P2 follows the circuit connected from one active area (ex. A2, A3) inner the memory cell (ex. C1, C2) through via V1, and each pattern P2 is further connected to the MTJs (MTJ2, MTJ4) set up above through via V2. In the embodiment of present invention, MTJ1-MTJ4 function as storage devices in the MRAM, which are preferably set up in the BEOL interconnects and might be compatible and integrated in CMOS process nowadays. For example, as shown in the figure, the MTJ2, MTJ4 are preferably set up in the level of via V2 between the second metal layer M2 and the third metal layer M3 (may be inserted in via V2), while the MTJ1, MTJ3 are preferably set up in the level of via V3 between the third metal layer M3 and the fourth metal layer M4 (may be inserted in via V3). More specifically, with respective to the MTJ2, MTJ4 at level Lv2 of the memory cell C1, the MTJ2 on the active area A2 may overlap the via V1 and contact CT below in vertical direction, while the MTJ4 on the active area A3 may be set up on a position shifting to the side close to the source line SL, so that the two MTJ2, MTJ4 may then be connected respectively and vertically to the bit lines BL1, BL2 above (i.e. defining positions of the two storage nodes on the layout in one memory cell).

Refer still to FIG. 2 and FIG. 3. Component patterns P3 in the third metal layer M3 above the second metal layer M2 and parts of the MTJs (MTJ1, MTJ3) in MRAM are illustrated in level Lv3. The components in level Lv3 are the same as the ones in level Lv2, with a combination of metal patterns P3 plus the MTJ1, MTJ3 set up thereon. More specifically, in the level Lv3, each pattern P3 follows the circuit connected from the corresponding MTJ2, MTJ4 through via V2, and each pattern P3 is further connected to the bit lines BL1, BL2 set up above through via V3, while the MTJ2, MTJ4 are inserted respectively in the two vias V3. In the design of present invention, please note that the first MTJ1 and second MTJ2 belong to first MTJ set S1. The two MTJs is in series connection, with one terminal connected to a corresponding active area A2 below and the other terminal connected to the first bit line BL1 above. In the same way, the third MTJ3 and fourth MTJ4 belong to second MTJ set S2. The two MTJs is in series connection, with one terminal connected to a corresponding active area A3 below and the other terminal connected to the second bit line BL2 above. As shown in FIG. 3, the essential feature of the design of present invention lies that each MTJ set is provided with at least two MTJs stacked in vertical direction, which may be set up in via in the same or different levels, ex. V2, V3, V4 and so on. The MTJs in each MTJ set will be driven by one corresponding current in operation, so they are considered in the same set. With this design, the number of storage devices may be increased in limited unit layout area, and multistate write and read operations may be implemented through specific access mechanism, hich will be described in following embodiments.

Refer still to FIG. 2 and FIG. 3. In the preferred embodiment of present invention, only a first bit line BL1 and a second bit line BL2 are set up in level Lv4, which are parts of the fourth metal layer M4. The bit lines BL1, BL2 extend in the first direction D1 over multiple word lines WL1-WL6 and overlap the active area AA, wherein the first bit line BL1 generally overlap the MTJ1, MTJ3 below (i.e. the first MTJ set S1 on the first node N1), while the second bit line BL2 generally overlap the MTJ2, MTJ4 (i.e. the second MTJ set S2 on the second node N2) and the source line SL below. The first bit line BL1 and second bit line BL2 are shared respectively by the first MTJ set S1 and the second MTJ set S2 of every memory cell in corresponding memory column.

After the aforementioned layout and vertical interconnection of MRAM in the present invention is described, several write operations of the aforementioned MRAM will be described in following embodiment, in order to provide a better understanding of the operation mechanism of this MRAM structure for readers.

Figure 4:
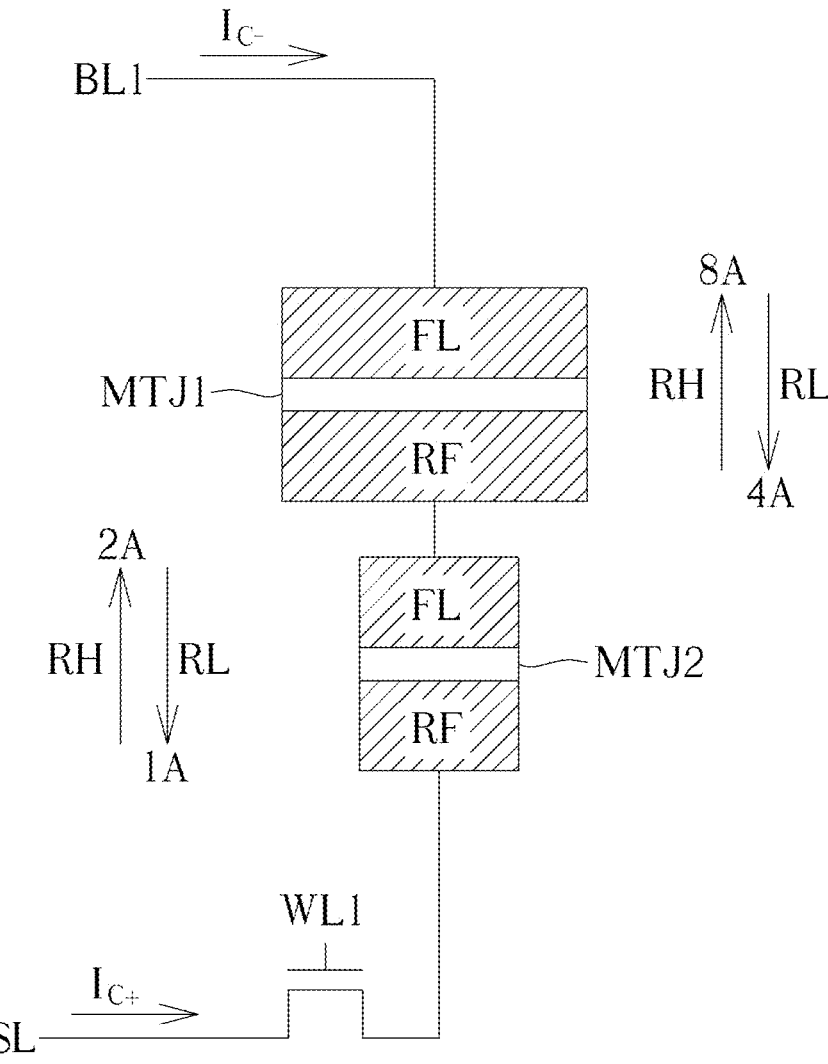
FIG. 4 is a schematic diagram illustrating several write operations of the MRAM in accordance with the preferred embodiment of present invention.

In the embodiment of present invention, the MTJs in the same MTJ set would be provided designedly with different threshold current. The so-call threshold current is defined as a current capable of altering the storage state of MTJ into required storage state when an applied current is larger than the threshold current. Specifically, as shown in FIG. 4, take the first MTJ set S1 as an example, the first MTJ1 therein has a predetermined first high-level resistance (RH) threshold current and a predetermined first low-level resistance (RL) threshold current. When an applied current is larger than the first RH threshold current, the first MTJ1 is changed into RH state, while the applied current is a reverse current and larger than the first RL threshold current, the first MTJ1 is changed into RL state. In the embodiment, the second MTJ2 has a predetermined second RH threshold current and a predetermined second RL threshold current, and the first RH threshold current of the first MTJ1 (ex. 8A) is designedly larger than the first RL threshold current (ex. 4A), and further larger than the second RH threshold current (ex. 2A), and further larger than the second RL threshold current (ex. 1A). In principle, the threshold current of MTJ1 would be larger than the threshold current of MTJ2. However, in other embodiments, it might be, but not limited thereto, the MTJ2 below having larger threshold current.

Furthermore, in the embodiment of present invention, take MRAM in spin-transfer torque (STT) architecture as an example, each MTJ includes a free layer FL, a reference layer RF (or referred as pinned layer) and an insulating layer therebetween. The write principle of STT-MTJ is to spin the magnetic moment in ferromagnetic layer of the MTJ. For example, when the free layer FL and reference layer RF in MTJ1 have the same polarization direction, the resistance of MTJ is smaller, which may be defined as being in "0" storage state. On the other hand, when the free layer FL and reference layer RF in MTJ1 have opposite polarization directions, the resistance of MTJ is larger, which may be defined as being in "1" storage state. The read mechanism of STT-MTJ is applying small current for measuring the resistance of target MTJ and obtaining its storage state, thereby achieving binary storage mode.

Refer still to FIG. 4. The write operation of present invention is designed as applying current from bit line to write RL state and applying current from source line to write RH state. In order to implement this kind of mechanism, the free layer FL of each MTJ is preferably set up at the terminal connected to the bit line, while the reference layer RF is set up at the terminal connected to the source line, and MTJs in the same MTJ set are in order and series connection, which may be driven by a current at the same time to conduct their read/write operation. With this design, when the write current is applied from bit line, the polarization direction of free layer FL under the influence of magnetic field will be span to a direction the same as the one of reference layer RF, rendering it in RL state. On the other hand, when the write current is applied from the source line, the polarization direction of free layer FL under the influence of magnetic field will be reversely span to a direction opposite to the one of reference layer RF, rendering it in RH state.

Take the first MTJ set S1 in the figure as an example, in an operation of writing the MTJ1 and the MTJ2 as RL/RL state, a write current $I_{c-}$ is applied from the first bit line BL1 and the first word line controls the channel switch during the write/read operation. Since the two MTJ1, MTJ2 are both to be written as RL state in this operation, the write current $I_{c-}$ should be at least larger than the first RL threshold current of MTJ1, ex. $I_{c-}>4A$, so that the MTJ1 and MTJ2 in the first MTJ set are both written as low-level resistance state (RL/RL).

In another aspect, in an operation writing the MTJ1 and the MTJ2 respectively as low-level resistance state and high-level resistance state (RL/RH), the MTJ1 and MTJ2 may be firstly written as RL/RL state. Thereafter, a write current $I_{c+}$ is applied from the source line SL with a value between the first RH threshold current and the second RH threshold current (i.e. $8A>I_{c+}>2A$), so that the MTJ2 in first MTJ set S1 is changed into RH state, while the MTJ1 maintains in RL state since the write current $I_{c+}$ doesn't exceed the first RH threshold current (8A), thereby achieving a storage state RL/RH.

In still another aspect, in an operation writing the MTJ1 and the MTJ2 both as high-level resistance state (RH/RH), in the same way, it may be understood that the MTJ1 and MTJ2 in first MTJ set S1 may be written as RH/RH state if a write current $I_{c+}$ larger than the first RH threshold current is applied from the source line (i.e. $I_{c+}>8A$).

In still another aspect, in an operation writing the MTJ1 and MTJ2 respectively as high-level resistance state and low-level state (RH/RL), the MTJ1 and MTJ2 may be firstly written as high-level resistance state (RH/RH). Thereafter, a write current $I_{c-}$ is applied from the first bit line BL1 with a value between the first RL threshold current and the second RL threshold current (i.e. $4A>I_{c-}>1A$), so that the MTJ2 in first MTJ set S1 is changed into RL state, while the MTJ1 maintains in RH state since the write current $I_{c-}$ doesn't exceed the first RL threshold current (4A), thereby achieving a storage state RH/RL.

The embodiment above describes explicit write operations of the MRAM of present invention, it may be understood that under this architecture, each MTJ set may have 2N storage states, depending on the number N of MTJs set up therein. For example, in the preferred embodiment, each MTJ set is provided with two MTJs, which may implement fourth different storage states RL/RL, RL/RH, RH/RH and RH/RL. In following embodiment, a read mechanism of these storage states will be described with reference to FIG. 5.

Figure 5:
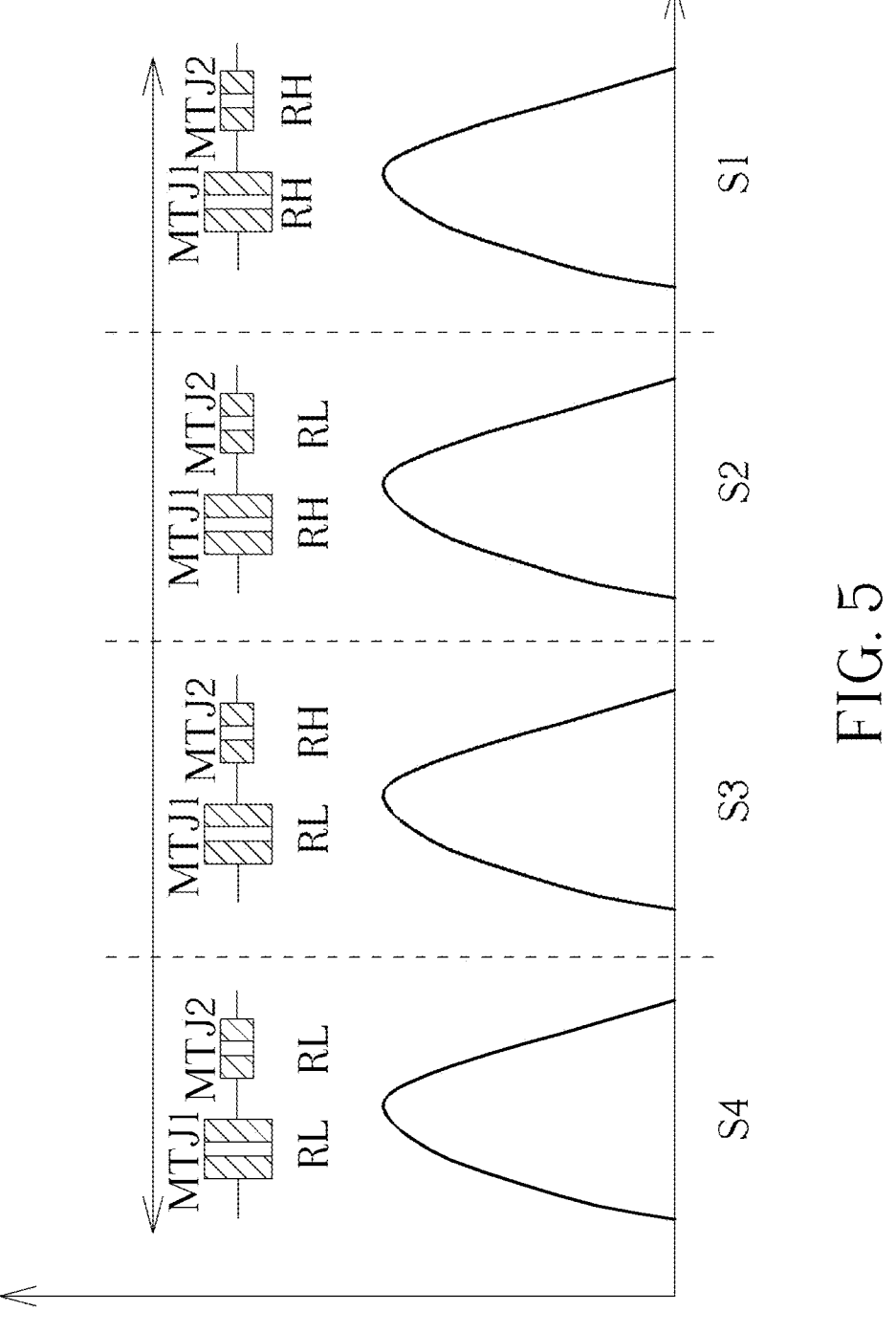
FIG. 5 is a schematic graph illustrating a read operation of the MRAM in accordance with the preferred embodiment of present invention.

As shown in FIG. 5, which is a schematic graph illustrating the read operation of MRAM in accordance with the preferred embodiment of present invention, wherein x-axis in the graph represents resistance R and y-axis in the graph represents the distribution of resistance R. This graph may be used to determine the storage state of a MRAM cell through applying small current for measuring the resistance R of MTJ. With respect to the aforementioned MTJ with four different storage states RL/RL, RL/RH, RH/RH and RH/RL, the resistance measured from a MRAM cell may be located in four distinct resistance intervals S1-S4, Among them, a measured resistance locating in the interval S1 represents the two MTJ1 and MTJ2 in series connection are both in high-level resistance state (RH/RH), a measured resistance locating in the interval S2 represents the larger MTJ1 and smaller MTJ2 in the two MTJs are respectively in high-level resistance state and low-level resistance state (RH/RL), a measured resistance locating in the interval S3 represents the larger MTJ1 and smaller MTJ2 in the two MTJs are respectively in low-level resistance state and high-level resistance state (RL/RH), and a measured resistance locating in the interval S4 represents the MTJ1 and MTJ2 are both in low-level resistance state (RL/RL). The storage state of every MTJ may be precisely read in this way. Please note that, since the present invention adopts a MRAM architecture having three transistors in series connection, the read current used in the operation will be larger than normal, so that read speed may be further improved. In addition, the current will flow through the three transistors in read operation, which may prevent excess resistance variation of respective transistors that may influence the result of measurement.

It may be understood from the aforementioned embodiments that the present invention features a design of multiple MTJs stacked and series-connected on each storage node, cooperating with specially-designed write/read mechanisms to implement multistate write/read operation, improving memory capacity in unit layout area, which is the advantage and non-obviousness of present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MRAM circuit with multiple memory cells, wherein each of said memory cells comprises:

three transistors, comprising a first transistor, a third transistor and a second transistor in order and series connection, wherein a junction directly connecting said first transistor to said third transistor is a first node, a junction directly connecting said second transistor to said third transistor is a second node, one terminal of each of said first transistor and said second transistor is connected to a common source line;

a first MTJ set, comprising at least two MTJs connected in series with one terminal connecting to said first node; and a second MTJ set, comprising at least two MTJs connected in series with one terminal connecting to said second node.

2. The MRAM circuit of claim 1, wherein another terminal of said first MTJ set is coupled to a first bit line, and another terminal of said second MTJ set is coupled to a second bit line.

3. The MRAM circuit of claim 1, wherein gates of said first transistor, said second transistor and said third transistor are connected respectively to a first word line, a second word line and a third word line.

4. The MRAM circuit of claim 1, wherein said first MTJ set comprises a first MTJ and a second MTJ, and one terminal of said first MTJ is coupled to a first bit line and one terminal of said second MTJ is coupled to said first node, and said second MTJ set comprises a third MTJ and a fourth MTJ, and one terminal of said third MTJ is coupled to a second bit line and one terminal of said fourth MTJ is coupled to said second node.

5. The MRAM circuit of claim 4, wherein said first MTJ is provided with a predetermined first high-level resistance threshold current and a first low-level resistance threshold current, said second MTJ is provided with a predetermined second high-level resistance threshold current and a second low-level resistance threshold current, and said first high-level resistance threshold current is larger than said first low-level resistance threshold current and further larger than said second high-level resistance threshold current and further larger than said second low-level resistance threshold current.

6. The MRAM circuit of claim 5, wherein in an operation of writing said first MTJ and said second MTJ as low-level resistance state, a current larger than said first low-level resistance threshold current is applied from said first bit line.

7. The MRAM circuit of claim 5, wherein in an operation of writing said first MTJ and said second MTJ respectively as low-level resistance state and high-level resistance state, said first MTJ and said second MTJ are written as low-level resistance state firstly, then a current between said first high-level resistance threshold current and said second high-level resistance threshold current is applied from said source line.

8. The MRAM circuit of claim 5, wherein in an operation of writing said first MTJ and said second MTJ as high-level resistance state, a current larger than said first high-level resistance threshold current is applied from said source line.

9. The MRAM circuit of claim 5, wherein in an operation of writing said first MTJ and said second MTJ respectively as high-level resistance state and low-level state, said first MTJ and said second MTJ are written as high-level resistance state firstly, then a current between said first low-level threshold resistance current and said second low-level resistance threshold current is applied from said first bit line.

10. The MRAM circuit of claim 4, wherein four predetermined and individual resistance intervals comprising a first resistance interval, a second resistance interval, a third resistance interval and a fourth resistance interval are provided in read operation of said first MTJ set, and said first resistance interval is higher than said second resistance interval and further higher than said third resistance interval and further higher than said fourth resistance interval, and a read resistance is determined to be in said first resistance interval when each of said first MTJ and said second MTJ is in a high-level resistance state, the read resistance is determined to be in said second resistance interval when said first MTJ is in the high-level resistance state and said second MTJ is in the low-level resistance state, the read resistance is determined to be in said third resistance interval when said first MTJ is in a low-level resistance state and said second MTJ is in the high-level resistance state, and the read resistance is determined to be in the said fourth resistance interval when each of said first MTJ and said second MTJ is in the low-level resistance state.

11. A MRAM layout with multiple memory cells on a substrate, and said substrate is provided with multiple active areas arranged in a first direction, wherein each of said memory cells comprises:

a first word line, a third word line and a second word line arranged sequentially and spaced-apart on said substrate and extending in a second direction over said active areas, wherein an active area at outer side of said first word line is first active area, an active area between said first word line and said third word line is second active area, an active area between said second word line and said third word line is third active area, and an active area at outer side of said second word line is fourth active area;

a first MTJ set, comprising at least two MTJs connected in series between a first terminal and a second terminal at different levels of BEOL metal layers and with the first terminal connected to said second active area;

a second MTJ set, comprising at least two MTJs connected in series between a third terminal and a fourth terminal at different levels of said BEOL metal layers and with the third terminal connected to said third active area;

a first bit line, connected to the second terminal of said first MTJ set; and a second bit line, connected to the fourth terminal of said second MTJ set, wherein one of the second terminal or the fourth terminal is directly connected to a bit line.

12. The MRAM layout of claim 11, wherein said first word line, said first active area and said second active areas constitute a first transistor, said second word line, said third active area and said fourth active area constitute a second transistor, and said third word line, said second active area and said third active area constitute a third transistor.

13. The MRAM layout of claim 11, wherein said first active area and said fourth active area are connected to a common source line.

14. The MRAM layout of claim 13, wherein said source line is in a level of first metal layer (M1), and said source line extends over multiple said memory cells.

15. The MRAM layout of claim 11, wherein said first bit line and said second bit line are in a level of fourth metal layer (M4) and extend in said first direction.

16. The MRAM layout of claim 11, wherein said first MTJ set comprises a first MTJ and a second MTJ connected in series, and said second MTJ set comprises a third MTJ and a fourth MTJ connected in series, and said first MTJ and said third MTJ are in a level between a third metal layer (M3) and a fourth metal layer (M4), and said second MTJ and said fourth MTJ are in a level between a second metal layer (M2) and said third metal layer (M3), wherein M4 overlaps M3 in a vertical direction, and M3 overlaps M2 in said vertical direction.

17. The MRAM layout of claim 16, wherein one terminal of said second MTJ is connected to said second active area, one terminal of said third MTJ is connected to said second bit line, and one terminal of said fourth MTJ is connected to said third active area.

* * * * *